United States Patent [19]

Kuhnert et al.

[11] Patent Number: 4,757,031
[45] Date of Patent: Jul. 12, 1988

[54] METHOD FOR THE MANUFACTURE OF A PN-JUNCTION HAVING HIGH DIELECTRIC STRENGTH

[75] Inventors: Reinhold Kuhnert, Munich; Hans-Joachim Schulze, Anzing, both of Fed. Rep. of Germany

[73] Assignee: Siemens Aktiengesellschaft, Berlin & Munich, Fed. Rep. of Germany

[21] Appl. No.: 86,269

[22] Filed: Aug. 17, 1987

[30] Foreign Application Priority Data

Sep. 30, 1986 [DE] Fed. Rep. of Germany ....... 3633188

[51] Int. Cl.⁴ .................................. H01L 21/383
[52] U.S. Cl. .................................. 437/154; 437/141; 437/958
[58] Field of Search .................. 437/154, 141, 958

[56] References Cited

U.S. PATENT DOCUMENTS

| 3,203,840 | 8/1965 | Harris | 437/154 |
| 3,271,211 | 9/1966 | Pritchard et al. | 437/154 |
| 3,341,380 | 9/1967 | Mets et al. | 437/154 |
| 3,387,360 | 6/1968 | Nakamura et al. | 437/154 X |
| 3,436,282 | 4/1969 | Shoda | 437/154 X |
| 4,416,708 | 11/1983 | Abdoulin et al. | 437/154 |

FOREIGN PATENT DOCUMENTS

| 64925 | 4/1982 | Japan | 437/154 |
| 196018 | 11/1983 | Japan | 437/154 |
| 2163597 | 2/1986 | United Kingdom | 437/154 |

Primary Examiner—George T. Ozaki
Attorney, Agent, or Firm—Hill, Van Santen, Steadman & Simpson

[57] ABSTRACT

A method for the manufacture of a pn-junction having high dielectric strength starting with a doped semiconductor body of a first conductivity type. A zone of a second conductivity type is formed in the semiconductor body inwardly from a surface thereof. At least one recess is then provided inwardly from the surface and including a recess which is formed at the extreme marginal edge of the semiconductor body. Dopant of the second conductivity type is diffused into the semiconductor body to form zones of varying dopant penetration depths from the center of the body to the marginal edge.

8 Claims, 2 Drawing Sheets

METHOD FOR THE MANUFACTURE OF A PN-JUNCTION HAVING HIGH DIELECTRIC STRENGTH

BACKGROUND OF THE INVENTION

1. Field of the Invention

The present invention is directed to a method for the manufacture of a pn-junction having high dielectric strength and which extends essentially parallel to the boundary surface of a doped semiconductor body, the penetration depth approaching the boundary surface at its marginal edge.

2. Description of the Prior Art

There are known methods of the type herein involved wherein one or more field limiting ring structures are provided to surround the pn-junction and are diffused into the semiconductor body simultaneously with the pn-junction. These ring structures have a penetration depth which corresponds to that of the pn-junction. They are disconnected from external potentials during operation and act as voltage dividers, the division ratios being defined by their mutual spacing and the distance of the innermost ring structure from the pn-junction. The book by Blicher entitled "Thyristor Physics", Springer-Verlag 1976, pages 231-234 can be referred to in this respect. The disadvantage of such ring structures is that they require relatively large semiconductor surface in order to achieve high breakdown voltages and they are extremely sensitive to surface charges.

SUMMARY OF THE INVENTION

The present invention provides a method for the manufacture of a pn-junction in a relatively simple procedure to produce a space saving pn-junction having high dielectric strength. This is accomplished by providing a doped semiconductor body of a first conductivity type, forming a zone of a second conductivity type in the body inwardly from a surface thereof, forming at least one groove in the zone of second conductivity type which includes a marginal edge of the body and diffusing dopant of the second conductivity further into the semiconductor body to form zones of varying dopant penetration depths from the center of the body to the marginal edge.

The method of the present invention permits the manufacture of a pn-junction with relatively simple method steps whereby the grooves or recesses formed along the lateral dimension of the semiconductor, including grooves spaced laterally from the marginal edge thereof provide a largely uniform distribution of the dopant concentration in the longitudinal direction of the grooves with a relatively low usage of semiconductor area. A high breakdown voltage of the pn-junction is thereby achieved.

In a preferred form of the invention, additional grooves are formed inwardly from the marginal edge of the body at constant distances from the marginal edge. The body is preferably circular and the grooves are concentric with each other about the axis of the circular body.

In a further improvement according to the present invention, the ratio of spacing between adjoining grooves to the width of the grooves decreases as the distance of the grooves from the center axis of the body increases. The width of an individual groove is preferably less than twice the penetration depth of the semiconductor region below the middle of the groove.

In one form of the invention, the depth of the zone of the second conductivity type does not exceed the depth of the grooves.

BRIEF DESCRIPTION OF THE DRAWINGS

The invention shall be set forth in greater detail with reference to the accompanying drawings in which:

FIG. 1 illustrates a semiconductor body 1 composed, for example, of n-doped silicon having a dopant concentration of $10^{14} cm^{-3}$ into which a p-conductive semiconductor region is to be formed. A dopant, for example, aluminum which provides a p-conduction is introduced into a zone 2 extending from the upper boundary surface 1a of the semiconductor body. The aluminum is introduced by means of a first pre-diffusion step which is also referred to as "pre-deposition". The diffusion source introduces the dopant through the boundary surface 1a into the zone 2 at a temperature of about 1060° C. within a definite time span, for example, for a duration of seven hours. The zone 2 which is thereby produced may have a depth of 5 to 10 μm and a dopant concentration at the edge side 2a in immediate proximity to the boundary surface 1a of $10^{19} cm^{-3}$.

Figure 2:
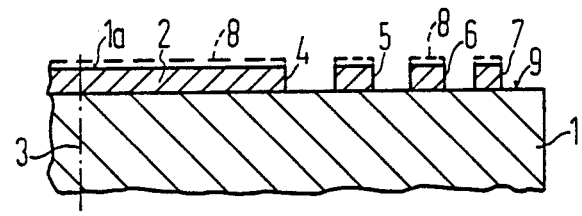

In the following method step, the zone 2 is structured as shown in FIG. 2. As illustrated in that figure, the semiconductor body 1 preferably has a shape of a flat cylindrical wafer having a circular cross-section, the vertical axis proceeding through the center of the cross-sectional surface being identified at reference 3. In this step, recesses 4 to 7 are provided in the zone 2. The boundary surface 1a is first covered with an etching mask 8 which is structured on the basis of known photolithographic steps to produce the recesses 4 to 7 in predetermined positions. In the following etching process, the recesses 4 to 7 extending down to the lower boundary surface 9 of the zone 2 are then produced. The recess 7 includes the extreme marginal edge of the semiconductor body 1. The recesses 4 to 6 have a predetermined distance from the recess 7 or from the lateral extreme marginal edge 2a of zone 2. The floor or base of the recesses 4 to 7 in the case of circular semiconductor bodies comprise the shape of concentric circular rings. If the widths of the individual recesses are identified as w and the spacing between two recesses lying adjacent to each other is identified as d, the value d/w then decreases with progressively increasing distance r of the recesses from the axis 3.

Figure 3:
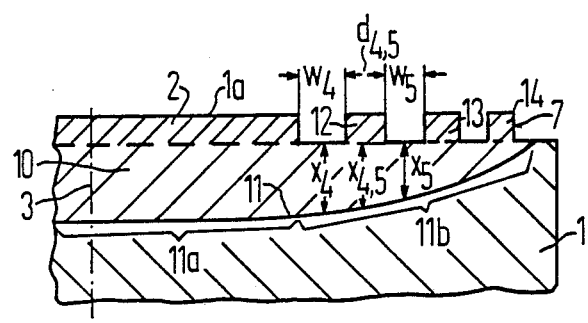

Next, a tempering or diffusion step referred to as an after-diffusion step is carried out such that the semiconductor body shown in FIG. 2 is exposed to a temperature of about 1240° C. during a time interval of, for example, 20 hours after the removal of the diffusion source. The dopant atoms introduced during the initial occupation are thereby diffused from the portions of the zone 2 remaining in accordance with FIG. 2, diffusing farther into the central portion nearest the axis 3. A p n-conductive region 10 is produced as shown in FIG. 3 which is separated from the remaining parts of the semiconductor body 1 by a pn-junction 11. The dopant atoms diffused in from the central portion of the zone 2 which includes no recesses provides a first portion 11a of the pn-junction which proceeds essentially parallel to the boundary surface 1a, whereas the dopant atoms which diffuse in from the annular ribs 12 to 14 of the zone 2 which exist between the recesses 4 to 7 produce a portion 11b of the pn-junction which gradually approaches the bottom surface 9 of the recess 7. This approach occurs so gradually that an extremely high breakdown voltage comparable to the volume breakdown voltage existing for the region 11a is reached for the portion 11b when an external voltage which biases the pn-junction 11 in the non-conducting direction is applied.

Specifically, the parameters w and d of the individual recesses 4 to 7 are selected such that they are significantly less than twice the penetration depths of the diffusion zones measured at the center of the recesses. As illustrated in FIG. 3, the width $w_4$ is significantly smaller than twice the dimension $x_4$, where $x_4$ is measured at the center of the penetration depth shown in FIG. 3 underlying the recess 4. Similarly, the width $w_5$ is significantly smaller than twice the value $x_5$ where $x_5$ corresponds to the penetration depth under the center of the recess 5. The distance $d_{4,5}$ between the recesses 4 and 5 is significantly smaller than twice the value $x_{4,5}$ where $x_{4,5}$ refers to the penetration depth under the center of the structural part 12.

The production of a two stage diffusion is known, per se, from the book by Warner, "Integrated Circuits", 1965, McGraw-Hill Book Company, New York, in particular, at page 294, paragraph 4. This publication does not, however, refer to a structuring step preceding the after-diffusion.

The structuring step according to the present invention assures that the dopant concentration in the parts of the semiconductor region 10 lying beneath the recesses 4 to 7 gradually decreases with increasing distance from the axis 3 so that the penetration depth of the semiconductor region 10 is correspondingly reduced with increasing distance from the axis 3.

Figure 1:
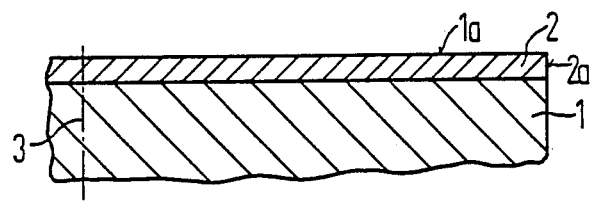
FIGS. 1 to 3 inclusive illustrate individual method steps in the manufacture of a pn-junction in accordance with a first embodiment of the present invention.
Figure 4:
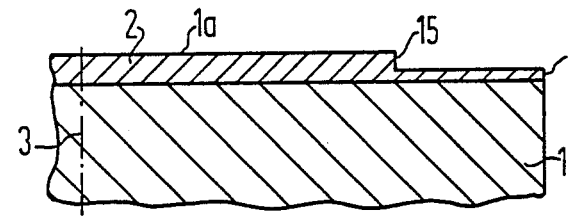
FIGS. 4 and 5 illustrate individual method steps of a second embodiment of the invention.
Figure 5:
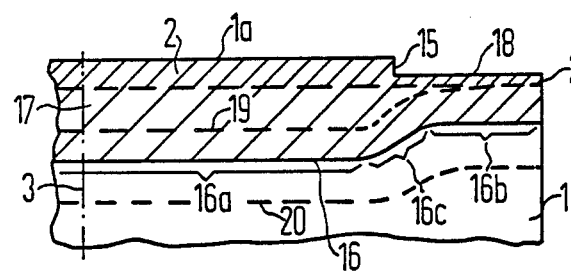

An alternative form of the invention provides, after the dopant penetration of the semiconductor body 1 in accordance with FIG. 1, a zone 2 shown in FIG. 4 which is provided with only a single recess 15 in the structuring step. This single recess 15 proceeds inwardly from the lateral edge limit 2a of the zone 2. The depth of the recess 15 is made less than the penetration depth of the zone 2. When the semiconductor body 1 is structured as shown in FIG. 4 and is then subjected to the aforementioned tempering or diffusion step, a pn-junction 16 is produced as shown in FIG. 5 between the p-conductive semiconductor region 17 and the remaining portion of the semiconductor body 1. The pn-junction 16 extends over the entire cross-section of the body 1. A first portion 16a of the pn-junction which is situated under the central portion of the zone 2 corresponds to the portion 11a of the pn-junction 11 shown in FIG. 3. In contrast to FIG. 3, however, a second portion 16b extends under the recess 15 parallel to the boundary surface 1a, the distance from the circular bottom surface 18 of this recess 15 being dependent on the etching depth of the recess 15. With increased etching depth, the distance between portions 16b and surface 18 is reduced. A third portion 16c exists under the left hand limitation of the recess 15, the third portion 16c representing the junction between 16a and 16b. When the semiconductor body 1 is supplied with a voltage by means of electrodes, the voltage biases the pn-junction 16 in a non-conducting direction, and a space charge zone having an upper limitation 19 and a lower limitation 20 is produced. When the etching depth of the recess 15 is selected such that only a relatively thin partial layer of the zone 2 remains in the region thereof, then the space charge zone 19, 20 fans out in the direction toward the lateral boundary edge 2a of the zone 2 such that it reaches the lower boundary surface 18 of the zone 2. A high breakdown voltage of the pn-junction thus achieved at the surface side.

Figure 6:
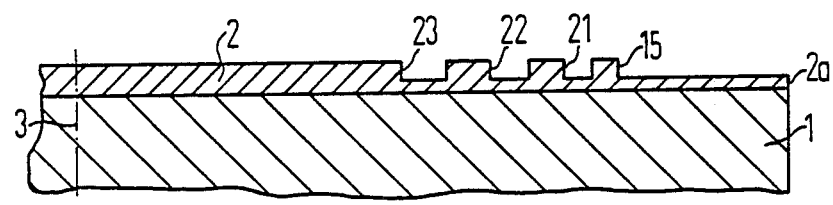
FIGS. 6 and 7 illustrate individual method steps in a third embodiment of the method of the present invention.
Figure 7:
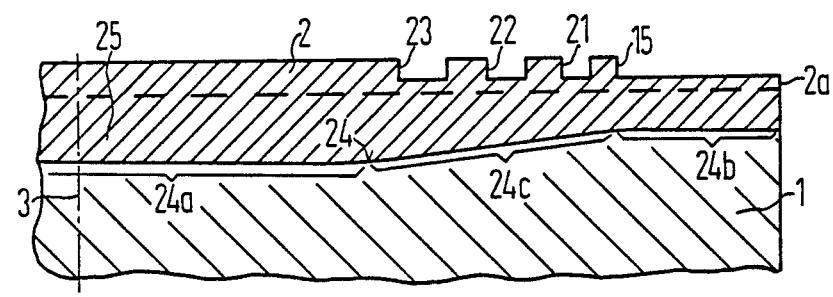

A further alternative embodiment of the method of the invention is produced wherein the zone 2 which has arisen in the dopant penetration of the semiconductor body 1 as shown in FIG. 1 is not only provided with a recess 15 in a structuring step in accordance with FIG. 6, but is also additionally provided with further recesses 21 to 23 which are arranged at constant distances from the lateral marginal edge 2a of the zone 2. The grooves 21 to 23 of FIG. 6 differ from the recesses 6, 5 and 4 of FIG. 3 only in that their depth is smaller than the penetration depth of the zone 2 and, in particular, correspond to the depth of the recess 15 of FIG. 4. When a semiconductor body 1 structured as shown in FIG. 6 is subjected to the aforementioned tempering step, there is produced, as shown in FIG. 7, a pn-junction identified at reference 24. This junction comprises individual portions 24a through 24c that separate the p-conductive semiconductor region 25 from the remaining portion of the semiconductor body. While the portions 24a and 24b roughly correspond to the portion 16a and 16b of FIG. 5, the portion 24c representing the junction is significantly flatter than the section 16c, so that an enhancement of the breakdown voltage in the junction region 24c between the highly doped part and the lightly doped part of the p-conductive semiconductor region 25 is achieved in comparison to the semiconductor structure of FIG. 5.

As compared with other acceptors such as boron or gallium, the use of aluminum as a dopant provides the advantage that at given diffusion times and diffusion temperatures, greater penetration depths are achieved. Moreover with, employment of aluminum or gallium, for example, an out diffusion of another part of the acceptor atoms also occurs during the tempering step in addition to the drive-in of a part of the dopant atoms present in the zone 2. This outward diffusion occurs through the limiting surfaces of the zone 2 which simultaneously represent limiting surfaces of the semiconductor body 1. As a consequence of the structuring of the zone 2, these limiting surfaces grow in the region of the recesses, for example, 4 to 7, 15 and 21 to 23. The outward diffusion promotes a gradual reduction of the dopant concentration in the driven-in semiconductor regions 10, 17 or 25 in the regions of the recesses with increasing distance from the center of the semiconductor body 1.

Other embodiments of the present invention can occur, for example, for the production of n-conductive semiconductor regions in a p-doped semiconductor body. In this case, a donor dopant composed, for example, of phosphorus is then employed.

One of the advantages of the method of the present invention is that the dopant employed, for example, aluminum can be introduced into the zone 2 by way of a vacuum predeposition. The semiconductor body 1, in addition to at least one dopant source, may be introduced into a hollow member of quartz and, after evacuation, exposed to a prescribed diffusion temperature over a prescribed diffusion time. The diffusion time is such that a desired penetration depth of zone 2, for example, depth of 5 to 10 μm is achieved. A vacuum diffusion method which can be employed for this purpose is disclosed, for example, in J. Electrochem. Soc., Vol. 125, No. 6, June 1978, pages 957–962. With the use of vacuum coating, the zone 2 can be set precisely both in terms of the edge concentration as well as in the amount of dopant introduced overall and the etching process for structuring the zone 2 can be matched to the penetration depth which is obtained.

It will be evident that various modifications can be made to the described embodiments without departing from the scope of the present invention.

We claim as our invention:

1. A method for the manufacture of a pn-junction having high dielectric strength which comprises:
   providing a doped semiconductor body of a first conductivity type,
   forming a zone of a second conductivity type in said body inwardly from a surface thereof,
   forming at least one recess in said zone of second conductivity type including a marginal edge of said body, and
   diffusing dopant of said second conductivity type further into said semiconductor body to form zones of varying dopant penetration depths from the center of said body to said marginal edge.

2. A method according to claim 1 which includes the step of forming additional recesses inwardly from said marginal edge of said body at constant distances from said marginal edge.

3. A method according to claim 2 wherein said body is circular and said recesses are concentric with each other.

4. A method according to claim 2 wherein the ratio of spacing between adjoining recesses to the width of the recesses decreases as the distance of said recesses from the center axis of said body increases.

5. A method according to claim 4 wherein the width of an individual recess is less than twice the penetration depth of the semiconductor region below the middle of said recess.

6. A method according to claim 2 wherein the depth of said zone of second conductivity type does not exceed the depth of said recesses.

7. A method according to claim 2 wherein the depth of said recesses is less than the depth of said zone of second conductivity type.

8. A method according to claim 1 wherein said zone of second conductivity type is formed by vacuum predeposition.

* * * * *